(12) United States Patent
Woerdenweber (10) Patent No.: US 8,822,979 B2
(45) Date of Patent: Sep. 2, 2014

(54) ARRANGEMENT COMPRISING A SUPPORT AND SUPER-CONDUCTIVE FILM, VORTEX DIODE COMPRISING SAID TYPE OF ARRANGEMENT AND USE OF VORTEX DIODES FOR FILTERS

(75) Inventor: Roger Woerdenweber, Niederzier (DE)

(73) Assignee: Forschungszentrum Juelich GmbH, Juelich (DE)

( * ) Notice: Subject to any disclaimer, the term of this patent is extended or adjusted under 35 U.S.C. 154(b) by 1768 days.

(21) Appl. No.: 11/988,522

(22) PCT Filed: Jun. 28, 2006

(86) PCT No.: PCT/DE2006/001112
§ 371 (c)(1),
(2), (4) Date: Jun. 27, 2008

(87) PCT Pub. No.: WO2007/006252
PCT Pub. Date: Jan. 18, 2007

(65) Prior Publication Data
US 2009/0027140 A1    Jan. 29, 2009

(30) Foreign Application Priority Data
Jul. 12, 2005 (DE) .......................... 10 2005 032 422

(51) Int. Cl.
| | | |
|---|---|---|
| *H01L 29/06* | (2006.01) | |
| *H01L 39/22* | (2006.01) | |
| *H01B 12/00* | (2006.01) | |
| *H01L 39/14* | (2006.01) | |
| *H01L 39/24* | (2006.01) | |

(52) U.S. Cl.
CPC .......... *H01L 39/148* (2013.01); *H01L 39/2483* (2013.01); *H01L 39/14* (2013.01)
USPC ................ 257/34; 257/36; 505/191; 327/528

(58) Field of Classification Search
CPC ... H01L 39/148; H01L 39/2483; H01L 39/14; H01L 39/225; H01L 39/22; H01L 39/223; H01L 39/228; Y10S 505/702; Y10S 505/865; Y10S 505/874
USPC .................... 257/34, 36, 33, 38, 39, E39.012, 257/E39.015, E39.016, E39.019; 505/233, 505/191, 190; 327/528, 527
See application file for complete search history.

(56) References Cited

U.S. PATENT DOCUMENTS 4,608,296 A * 8/1986 Keem et al. .................... 428/215
4,828,931 A    5/1989 Ogawa et al.
(Continued)

FOREIGN PATENT DOCUMENTS

DE    199 27 661    12/1999

OTHER PUBLICATIONS

Villegas J E et al: "A superconducting reversible rectifier that controls the motion of magnetic flux quanta" Science American Assoc. Adv. Sci USA, vol. 302, No. 5648, Nov. 14, 2003, pp. 11-88-1191, XP002408726 ISSN: 0036-8075—the whole document.

(Continued)

*Primary Examiner* — Shouxiang Hu
(74) *Attorney, Agent, or Firm* — Jordan and Hamburg LLP (57) ABSTRACT

Disclosed is an arrangement including a support and a superconductive film which is arranged thereon. The film has a plurality of holes in order to form a perforated grating. The holes are optionally round holes having increasing sizes, triangular holes, or holes which are arranged in a meandering manner in the film, and which produce improved properties in relation to signal conversion by a vortex diode and/or in a filter. A DC signal is directly removed therein without additional electronics.

29 Claims, 5 Drawing Sheets

(56) References Cited

U.S. PATENT DOCUMENTS

| | | | |
|---|---|---|---|
| 6,175,749 B1 | 1/2001 | Woerdenweber | |
| 6,345,189 B1 | 2/2002 | Woerdenweber | |
| 6,345,190 B1 | 2/2002 | Woerdenweber | |
| 6,569,811 B1* | 5/2003 | Shi | 505/400 |
| 2009/0048113 A1* | 2/2009 | Crisan et al. | 505/235 |

OTHER PUBLICATIONS

Wordenweber R et al: "Guided vortex motion in high-Tc superconducting thin films and devices with special arrangements of artificial defects" Physica C, North-Holland Publishing, Amsterdam, NL, vol. 404, No. 11-4, May 1, 2004, pp. 421-425, XP004503420 ISSN: 0921-4534—the whole document.

Villegas J E et al: "Experimental ratchet effect in superconducting films with periodic arrays of ayymmetric potentials" Physical Review B (Condensed Matter and Materials Physics) APS Through AIP USA, vol. 71, No. 2, Jan. 1, 2005, pp. 245191-245195, XP002408727 ISSN: 0163-1829—p. 0245191, paragraph 1-p. 0246193, paragraph 1.

Van Look L et al: "Anisotropic vortex pinning by a square array of rectangular antidots" Physica C, North-Holland Publishing, Amsterdam, NL, vol. 369, No. 1-4, Mar. 15, 2002, pp. 113-117, XP004339833 ISSN: 0921-4534—the whole document.

Hoffmann A et al: "Periodic vortex pinning with magnetic and non-magnetic dots: The influence of size" Physical Review B (Condensed Matter) APS Through AIP USA, vo. 61, No. 10, Mar. 1, 2000, pp. 6958-6965, XP002408772 ISSN: 0163-1829—p. 6958, paragraph 1-p. 6959, paragraph 1.

Woerdenweber, R. et al.; "Vortez lattice matching effects and $1/f$-noise reduction in HTS films and devices equipped with regular arrays of artificial defects", Physica C, 332, (2000), pp. 27-34.

* cited by examiner

ARRANGEMENT COMPRISING A SUPPORT AND SUPER-CONDUCTIVE FILM, VORTEX DIODE COMPRISING SAID TYPE OF ARRANGEMENT AND USE OF VORTEX DIODES FOR FILTERS

BACKGROUND OF THE INVENTION

The invention relates to an arrangement made of substrate and superconducting film, a vortex diode including such an arrangement, and the use of vortex diodes for filters.

Resonators for filtering signals, such as e.g. cavity resonators, dielectric resonators, $\lambda/2$ resonators, and LC resonators are known from the prior art. It is disadvantageous that the known resonators are relatively large. Miniaturization of these filters is subject to limits because such miniaturization normally leads to a decrease in quality.

Filtering a plurality of frequency contributions is normally accomplished by splitting the signal into different channels. The signal in these channels is tested for the different frequencies using additional electronic devices. Alternatively, a complex method for scanning frequencies is known. In this case, as well, the need for downstream electronics and in some cases amplification of the output signal is disadvantageous.

Type II superconductors for filter purposes are known from the prior art. They completely displace a magnetic field until the value of the magnetic flux of $H_{c1} < H_c$, but remain superconducting up to a value of $H_{c2} > H_c$, $H_c$ being the thermodynamically defined critical magnetic field strength.

In contrast to Type I superconductors, in Type II superconductors the magnetic field partially penetrates into the superconductor for fields at values between $H_{c1}$ and $H_{c2}$. Due to the quantum condition that applies for the magnetic flux and due to the energetically advantageous formation of normal superconducting limiting surfaces, the magnetic field can be present solely as vortices.

Vortices are microscopic objects having a normal conducting core a few nanometers in diameter and having a magnetic flux that equals exactly one flux quantum $\Phi_o$ ($=2\times10^{-15}$ Weber) in the superconductor. In cavities in the superconductor, such as e.g. in perforations or superconducting rings, the magnetic flux equals whole-number multiples of the flux quantum.

In order to use Type II superconductors as conductor materials, e.g. for magnetic coils or cables, they must be able to carry relatively large currents in the magnetic field with no losses. For this, the vortices are fixed locally via pinning centers. If they were not fixed, they would move through the superconductor when a current was applied due to the Lorentz force $F_L$ and would generate dissipative effects and thus an electrical resistance. Type II superconductors with such pinning centers are also called hard superconductors.

An arrangement made of substrate and superconducting film with perforations is known from DE 199 27 661 A1. The perforations anchor vortices. A high frequency (HF) filter having such an arrangement demonstrates improved HF resistance.

In the filters from the prior art, it is a disadvantage that a downstream electronic device is always needed that converts the signal to a usable DC signal. In addition, in the past it has not been possible to filter a plurality of frequency contributions from one signal simultaneously using the filters from the prior art.

Depending on the filter, for the conversion to a DC signal, the electronic device includes e.g. an HF converter adapted to the application or an HF power measuring device.

The object of the invention is to provide an arrangement made of a substrate and a superconducting film for a filter having direct conversion of the signal to a DC signal. It is a further object of the invention to provide a filter with which a plurality of frequency contributions can be simultaneously filtered out, without an electronic device downstream, and can be converted to a DC signal.

SUMMARY OF THE INVENTION

The object is attained by an arrangement with all of the features in accordance with claim 1 and by a vortex diode and by using vortex diodes for a filter in accordance with subordinate claims.

Advantageous embodiments result from the claims that refer back.

The inventive arrangement includes a substrate and a superconducting film arranged thereon, preferably from a Type II superconductor.

In the framework of the invention it was found that guided motion of magnetic "Flussfäden", called "vortices" in English, from one side of the film to the other is produced using an asymmetric shape, size, or arrangement of the perforations in striplines or in the superconducting film. The terms "Flussfäden" and "vortices" shall be synonymous in the following.

The superconducting film has a plurality of perforations for embodying a perforation grid in the film. The arrangement is characterized by rows of round perforations that grow progressively larger or triangular perforations that are arranged in a selected orientation in the superconducting film. Both geometries in the superconducting film have proved advantageous in attaining the object.

The terms "round" and "triangular" also encompass substantially round or triangular structures. Moreover, the term "round" can include all round structures, that is, oval or even e.g. ellipsoidal structures, in addition to the preferred circular structures.

It is also possible to provide an arrangement made of substrate and superconducting film in which the perforations have identical geometries and are arranged in a wandering pattern in the superconducting film. Rows of perforations have a wandering pattern when there are at least two reversal points at which the perforations are arranged from one end of the superconducting film to the other.

It is also conceivable to provide a suitable combination of the aforesaid features in the superconducting film of the arrangement.

Cited simply as examples are triangles in a wandering pattern in the superconducting film or even in combination with round perforations. However, other suitable combinations of these features can also produce the desired signal conversion effect.

In one embodiment of the invention, the perforation grid in the superconducting film has perforations having a size between preferably 50 and 50,000 nanometers.

The interval between perforations, from perforation center to perforation center, should preferably range from about 100 to 50,000 nanometers.

High temperature superconductors made of e.g. $ReBa_2Cu_3O_7$, where Re=rare earth metal, are particularly advantageous. $BaSrCaCuO$ compounds, Tl-HTSL, Nb, Pb, Nb compounds, and A15 superconductors are also conceivable as materials. These materials can advantageously be deposited as a thin film on high frequency-capable substrates and are so-called Type II superconductors having great penetration depth and thus small critical fields $B_{c1}$.

The superconducting film can be arranged on the substrate as a thin film, in particular with a thickness of 0.1 to 2.0 μm.

Provided as substrate materials are in particular high frequency-capable materials, e.g. single crystals made of sapphire, $LaAlO_3$, MgO, or silicon.

These materials have advantageously low HF losses and good substrate properties. They are therefore particularly suitable for filters.

The inventive arrangement made of superconducting film and substrate is embodied such that it can embody a vortex diode.

The asymmetry from the shape can be embodied by non-equilateral triangles arranged in rows or by size, e.g. by progressive perforation sizes, or by the arrangement of the perforations themselves, e.g. in a wavy or wandering arrangement.

In this manner, due to the arrangement and/or shape of the perforations in the superconducting film, the guided motion of the vortices can be determined and the DC signal can be produced.

With adequate signal amplitude and a sufficiently low frequency of the signal, the guided motion of the vortices is prespecified in a direction to the end of the superconducting film or the stripline. The vortices are moved from one perforation to the next in a direction prespecified by the asymmetry in the perforation grid of the superconducting film.

In the vortex diode, an alternating current signal produces the direct voltage signal using the preferred direction of the guided motion of the vortices.

The guided motion of the vortices can be caused by a regular grid of triangular perforations that are not equilateral but that are isosceles. Perforations made of acute-angled triangles with the tips oriented perpendicular to the current direction cause a preferential guided vortex motion in the direction of the acute angle. The physical cause of the preferential guided vortex motion is the locally different density of the screening current that flows around each perforation in the superconductor and screens the magnetic flux to the superconductor in the perforation. The current density is exceeded at the tip of the triangle, and therefore nucleation of vortices is more probable at this location, due to the locally reduced superconducting properties, than at other locations of the edge of the perforation. Therefore the guided motion of the vortices out of the tip of the triangle is also simpler because their nucleation is easier.

Guided transport of the vortices using variation in the sizes of the perforations is also attained by using circular perforations are progressively larger within a row. The relationship of perforation size to vortices/perforation interaction is utilized. Larger perforations have a stronger draw on the vortices than small perforations. Therefore the vortices are transported starting from the smallest perforations in the direction of perforations having increasingly large radii, that is, a guided vortex motion to the larger perforations is preferred.

Finally, the direction of the Lorentz force can also be utilized on the vortices perpendicular to current and magnetic field. For this it is necessary to select the arrangement of the perforations suitably. E.g. a wavy, wandering arrangement of rows of identical perforations can be used that on the one hand connect both sides of the stripline and on the other hand in which the vortices run in nearly parallel to the current at the reversal points (so-called force-free configuration, since the Lorentz force is perpendicular to the current) in order then after the current has been inverted to run out perpendicular to the current (maximum Lorentz force) into the next arc. In the wandering pattern, it is possible to provide perforations with an enlarged diameter, e.g. at the reversal points.

All of the aforesaid options make it possible to structure a vortex diode and they are each based on different physical laws of vortex physics in superconductors. Where necessary they can also be combined with one another, e.g. using rows of triangles that grow increasingly larger. In any case, one skilled in the art in the field of superconduction is not limited by the exemplary embodiments cited herein with regard to producing novel vortex diodes for filters.

An electrical field is induced in the vortex diode perpendicular to the guided motion of the vortices as a function of the guided motion of the vortices. The DC voltage produced in this manner is detected via contacts and related to the filtered frequency.

The injected AC or HF signal induces an AC current in the superconducting film. A magnetic flux is already induced in the superconductor due to the earth's field that is present. Given suitable Type II superconductors and suitable geometry for the vortex diode, even the smallest fields are adequate for producing high vortex densities in the superconducting film. Thus, e.g. given the earth's field of about 0.5 Gauss some 25,000 vortices per $mm^2$ are formed in the superconducting film.

However, it is also possible e.g. to provide an electromagnetic coil for generating higher vortex densities in the superconducting film.

The vortices interact with the AC current and move from one perforation to the next based on the Lorentz force $F_L$ produced by the current. The vortices try to follow the Lorentz force $F_L$. With adequate signal amplitude and adequate low signal frequency there is guided motion of the vortices from perforation to perforation due to the attractive vortex/perforation interaction. The guided motion of the vortices induces the magnetic flux transport and thus an electrical field perpendicular to the guided motion of the vortices or antiparallel to the current. The voltage corresponding to this is present on the contacts of the filter and is detected and evaluated.

As a diode effect, the guided motion of the vortices thus occurs primarily in one direction, resulting in a DC voltage. Advantageously, with the inventive arrangement made of substrate and superconducting film, or stripline, no downstream electronic device is necessary for converting the signal to a DC signal.

Using the periodicity of the perforation grid in conjunction with the material properties, the maximum signal is generated when the guided motion of the vortices occurs synchronously from perforation to perforation within the perforations of a row.

This leads directly to the signal produced having the desired frequency dependency.

Depending on the injected frequency of the signal, the result is a net guided motion of vortices or a magnetic flux in a given direction.

For embodying a vortex diode, the arrangement normally has additional contacts on the superconducting film. The signal is fed in via an input contact and conducted into the superconducting stripline. They are then conducted out via an output, e.g. to a ground or a 50Ω terminal.

The DC signal is detected differentially at voltage contacts.

The vortex diode has means for cooling the superconductor below its critical temperature.

The "Bewegung" (English: guided motion) of the vortices in a vortex diode is maximum when the rows are oriented parallel to the Lorentz force and thus perpendicular to a current flow in the arrangement. It is minimum when the orientation of the rows is perpendicular to the Lorentz force.

A filter having the inventive arrangement or vortex diode also has the improved properties of the arrangement. Advantageously frequencies up to about 100 GHz are filtered and converted directly to a DC signal.

With regard to signal conversion, a filter having the inventive arrangement has the improved property, since the DC signal can be produced and detected without an additional conversion device.

In contrast to known filters, it is particularly advantageous that an inventive filter is comparatively small without limiting the quality.

For embodying the filter, it has at least one inventive arrangement made of superconducting film and substrate or one vortex diode.

The signal is injected into the filter by means of an antenna. Thereafter the signal is forwarded in the asymmetrically structured superconducting film in a guided motion of vortices.

In one inventive filter, preferably vortex diodes having about 10 to 10,000 rows of perforations are provided for embodying the perforation grid. The quality of the filter improves as the number of rows increases.

The invention is not at all limited to this. On the contrary, in the framework of the invention it was found that vortex diodes of any type, that is, even those that are already known from the prior art (Wördenweber, R., Dymashevski, P., Misko, V. R. (2004). Guidance of vortices ratchet effect in high-Tc superconducting thin films obtained by arrangement of antidotes. Physical Review B 69, 184504-1 ff.) can be used for filters.

New filters with improved properties with respect to signal conversion are advantageously provided using this measure alone.

The perforation interval in the superconducting film of an inventive arrangement or vortex diode is constant in the direction of motion of the vortices.

An inventive filter also normally has means for cooling, such as e.g. a cryocooler or liquid coolant.

Moreover, it has means for injecting and extracting the signal and a number of pairs of DC signals sensors that equals the number of frequency contributions.

A filter can thus advantageously also include more than one vortex diode.

When a plurality of vortex diodes are arranged in the filter with perforation grids that are different from one another, it is particularly advantageous that a plurality of frequency contributions can be filtered and converted simultaneously. The superconducting film with perforation grid in the vortex diodes has the function of the stripline in that the injected signal is forwarded without any loss. Different frequencies can be filtered and converted simultaneously using the stripline with different conductors having perforation grids.

BRIEF DESCRIPTION OF THE DRAWINGS

The invention is described in greater detail in the following using exemplary embodiments and the attached FIGS. 1 through 5.

Figure 1:
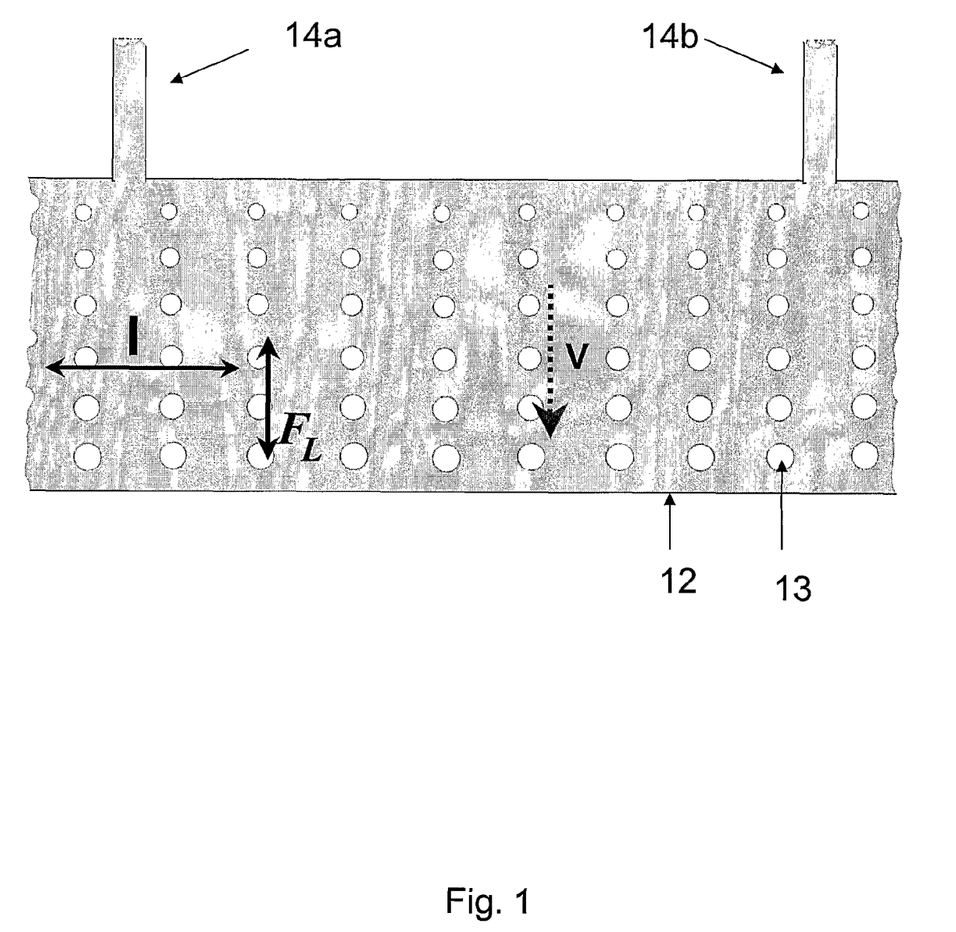
Figure 2:
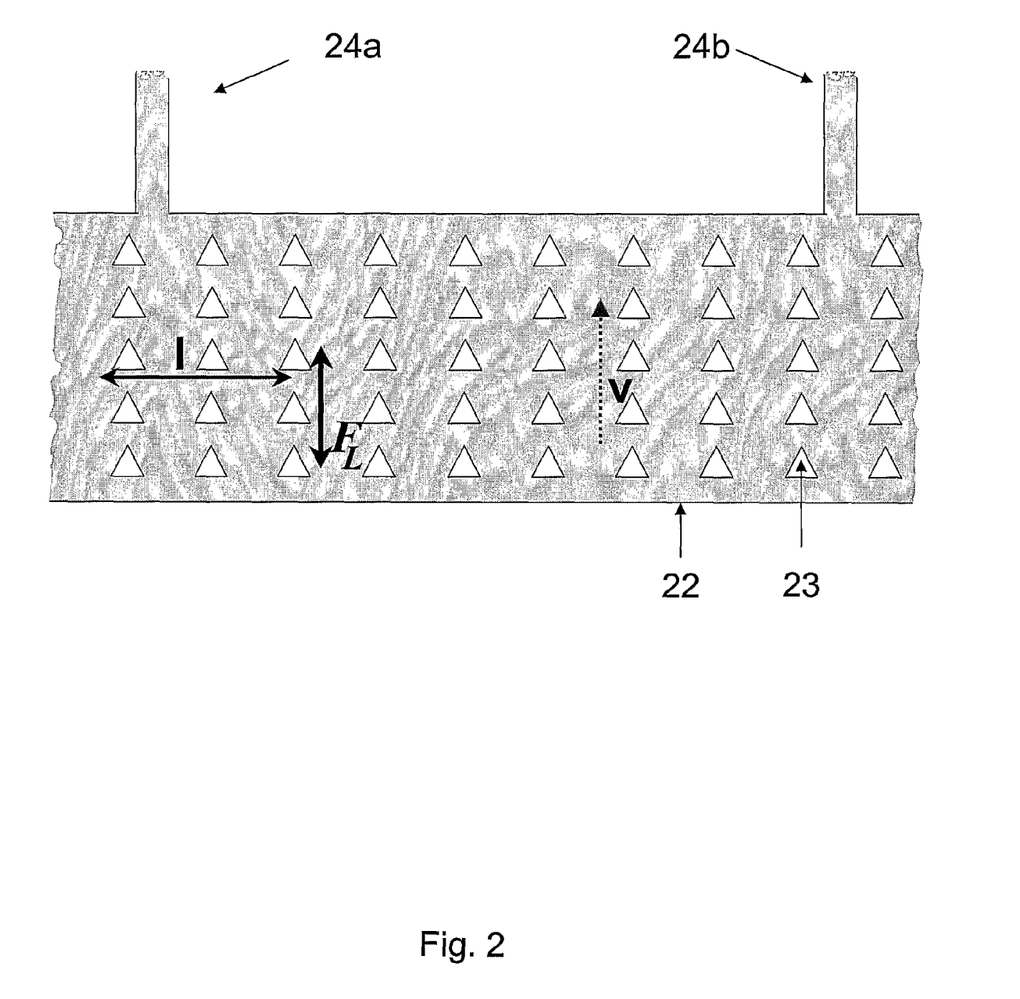

FIGS. 1 and 2 depict a rough schematic top view of an inventive perforation grid in a superconducting film 12, 22. The perforated grid includes a total of n (here: n=10) vertically arranged rows of circular or triangular perforations. The rows between contacts 14a, 14b or 24a, 24b are determinant for DC signal development.

I indicates the AC current and $F_L$ the Lorentz force. The double arrows indicate the direction of the AC current or the Lorentz force based on an applied HF signal. The guided motion of the vortices is indicated with v. The dotted arrow consequently indicates the direction of the preferential guided motion of the vortices in the superconducting film.

In FIG. 1, the interval between the perforations 13 is constant within the vertical rows in the direction of motion of the vortices from perforation edge to perforation edge and can range from 0.5 to 20 µm. The interval between the vertical rows can vary between 1 and 500 µm. The perforation size can be between about 0.5 and 50 µm in diameter.

In FIG. 2 the interval between the triangular perforations 23 is constant within the vertical rows from perforation edge to perforation edge and can be between about 0.5 and 20 µm. The interval between the rows themselves can vary from 1 to 500 µm.

The perforation size is about 0.5 to 20 µm.

In FIG. 1, asymmetry is produced by perforations 13 that become smaller in the rows, while in FIG. 2 it is produced by the shape of the triangular perforations 23 as such and thus the directed motion of the vortices in the diode is prespecified. In both superconducting films 12, 22 an injected AC or HF signal is therefore converted to a DC signal and detected via the contacts 14a and 14b (FIG. 1) or 24a and 24b (FIG. 2) and measured differentially via a voltmeter (not shown).

Figure 3:
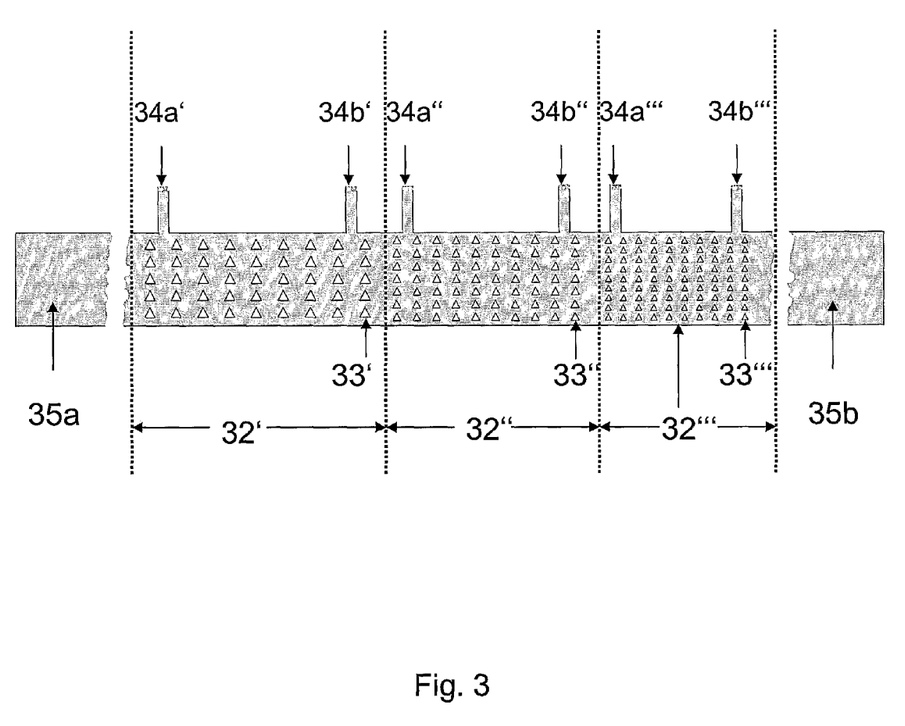

FIG. 3 depicts different perforation grids connected in series from the input 35a to the output 35b for simultaneously filtering different frequency contributions of an HF signal. Dotted lines delimit from one another the sections in the superconducting film that form the vortex diodes 32', 32", 32∝"'. In section 32' there are seven rows of triangular perforations between the DC detectors, and in each of sections 32" and 32"' there are eight vertical rows thereof.

The interval between the perforations within the vertical rows from perforation edge to perforation edge in sections 32', 32" and 32"' can vary between 0.5 and 20 µm. The interval between the rows themselves is about 1 to 500 µm.

Sections 32', 32" and 32"' each form a vortex diode so that in the present case a total of three vortex diodes are provided for filtering three frequency contributions.

It is critical for the embodiment of the vortex diodes that each interval between the triangular perforations 33', 33" and 33"' decreases in the vertically arranged rows from section 32' through 32" to 32"' and thus more perforations are arranged in each row. Five perforations per row are depicted in section 32', 7 perforations per row in section 32", and 9 perforations per row in section 32"'. A filter is created by adding perforations and rows of perforations.

In the high frequency filter in accordance with FIG. 3, frequency contributions in the superconducting stripline are fed into the input 35a and flow through the different diodes to the output 35b, e.g. a ground. A frequency contribution is filtered out in each of the different sections 32', 32", 32"' and detected and measured (not shown) via the DC contacts 34a' and 34b' or 34a" and 34b" or 34a"' and 34b"'.

Figure 4:
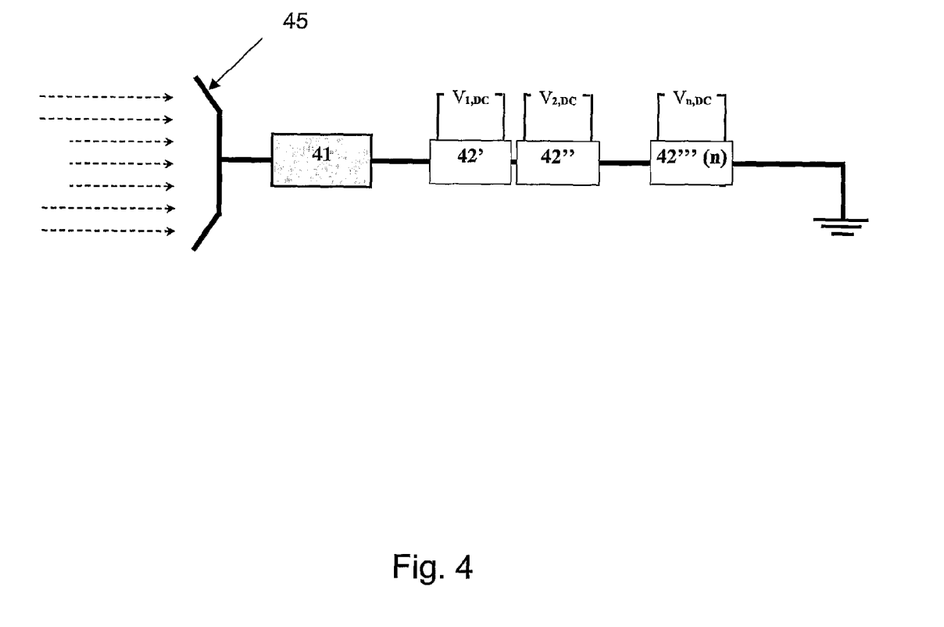

FIG. 4 is a schematic depiction of a filter based on vortex diodes having superconducting films 42', 42", 42"'. The signal, depicted by the horizontal arrow, is received by means of an antenna 45 and optionally amplified by an amplifier 41. The signal is now forwarded to vortex diodes having superconducting films 42', 42" and 42"'.

It is possible to provide a plurality of sequentially switched vortex diodes for filtering frequency contributions.

Figure 5:
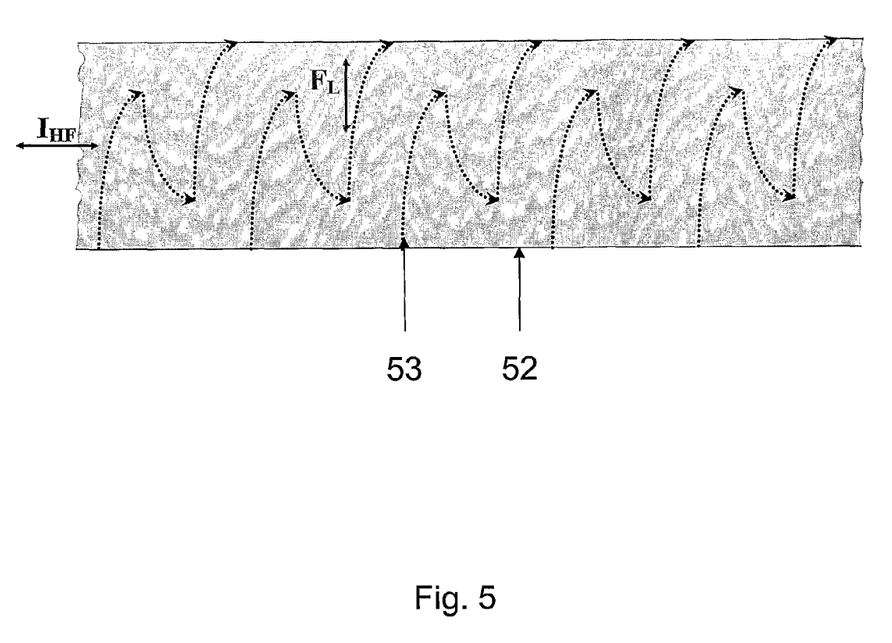

FIG. 5 depicts another option for embodying a vortex diode. In contrast to FIGS. 1 and 2, in this case it is an asymmetrical arrangement of identical perforations 53 (e.g., round perforations; non-equilateral, isosceles triangular perforations) that is determinant for the preferred direction in which the vortices move in the stripline or film 52, rather than the asymmetrical shape of perforations or antidots as such.

The vortices follow the Lorentz force FL, but due to the wandering arrangement of the perforations 53 are forced to move preferentially along the dotted perforation rows. At the reversal points, depicted by the tips of arrows, they are each guided farther in the branch parallel to the Lorentz force. The vortices move in a wandering manner in the direction of the arrow. Other components such as input, output, and contacts are not depicted.

The principle of guided motion for the vortices is identical in all of the exemplary embodiments. In all of the figures, the substrate (not shown) comprises an HF capable material, e.g. made of single crystals including sapphire, $LaAlO_3$, MgO, or silicon, the thickness of which should be selected according to impedance (generally 50Ω).

The superconducting film or stripline 12, 22, 32', 32", 32''', 42', 42", 42''', 52 comprises a Type II superconductor, e.g. made of $ReBa_2Cu_3O_7$, where Re=rare earth metal, BaSr-CaCuO compound, Tl-HTSL, Nb, Pb, or Nb compounds or A15 superconductor and is generally 0.1 to 2.0 μm thick. The average distance r, a vortex covers within a half wave (positive or negative current cycle) of the HF current is proportional to the amplitude of the signal ($I_{max}$) and the time τ, during which the current is present, that is, the time of the half phase. The time τ is inversely proportional to the frequency f, i.e. τ=1/f. Thus the distance is inversely proportional to the frequency, $r_v \propto I/f$. In order to produce a measurable signal, during one half wave the vortex must travel a distance that is greater than or equal to half the antidot interval. Since the latter is true, on the other hand the distance traveled is inversely proportional to the frequency, at a given signal amplitude there is a maximum signal amplitude up to which vortices can travel from one antidot to another. Adding the frequency leads to an HF signal, and thus to an HF current in the conductor. For its part, the latter exerts a Lorentz force on the vortices using the interaction with the magnetic field in the vortex. Due to the small lower critical fields Bc, and the demagnetization effect in planar superconductors, even the smallest fields lead to significant vortex densities, earth fields normally being adequate. The directed motion of the vortices is induced inter alia by interaction between the applied current and the magnetic field of the vortex. The vortices interact with the current.

A DC signal only occurs when a signal is injected that has adequate amplitude and has a frequency that is small enough.

Using the inventive filters it is possible e.g. to filter frequencies from about 1 MHz to 100 GHz and convert them immediately to a DC signal.

It is possible to combine the superconducting films depicted in FIGS. 1 through 5 and their features with one another in a suitable manner.

The invention claimed is:

1. A vortex diode, comprising:
a substrate; and
a superconducting stripline arranged thereon,
wherein the stripline has a plurality of perforations arranged in a plurality of non-straight rows and embodying a perforation grid, wherein each one row of said plurality of non-straight rows extends from one edge to an opposite edge of the stripline;
wherein for said each one row, the perforations are arranged along a path from a first perforation nearest said one edge to a second perforation at a first traversal of said opposite edge, said second perforation being a nearest perforation to said opposite edge among perforations in said one row;
wherein said path has a first reversal in direction formed by at least a third, fourth, and fifth perforation sequentially arranged along said path of said one row wherein the fourth perforation is closer to the opposite edge than the third perforation, and the fifth perforation is farther from the opposite edge than the fourth perforation;
wherein said path has a second reversal in direction formed by at least a sixth, seventh, and eighth perforation sequentially arranged along said path of said one row wherein the seventh perforation is closer to the opposite edge than the sixth perforation, and the eighth perforation is farther from the opposite edge than the seventh perforation; and
wherein said perforations of said perforation grid define probable locations for nucleation of vortices of the vortex diode, and wherein for a given row said path defines a path of guided motion of said vortices.

2. The vortex diode of claim 1, in which each one perforation among the plurality of perforations in the perforation grid has an isosceles triangular shape, wherein for each one perforation a tip occurring at a most acute angle defines a most probable point of nucleation of a vortex corresponding to said one perforation.

3. The vortex diode of claim 1, in which each one perforation among the plurality of perforations in the perforation grid has a round shape, and wherein for said given row a perforation at a reversal point has a larger area than another perforation in said one row.

4. The vortex diode in accordance with claim 1, wherein the perforation grid has a wandering pattern, and wherein said vortices run in nearly parallel to current at reversal points of the wandering pattern where a Lorentz force is perpendicular to the current, and thereafter when current has been inverted the vortices run out perpendicular to the current until a current arc is reached.

5. The vortex diode in accordance with claim 1, further comprising DC contacts for detecting a DC signal.

6. The vortex diode in accordance with claim 1, further comprising coolant for producing temperatures below a critical temperature of the superconducting stripline.

7. The vortex diode in accordance with claim 1, further comprising means for embodying a magnetic field stronger than the earth magnetic field.

8. The vortex diode in accordance with claim 7, wherein at least one electromagnetic coil is the means for embodying the magnetic field.

9. The vortex diode in accordance with claim 1, wherein a Type II superconductor is a material of the superconducting stripline.

10. The vortex diode in accordance with claim 1, wherein a perforation size of the perforations is between 50 and 50,000 nanometers.

11. The vortex diode in accordance with claim 1, wherein the superconducting stripline includes one of ReBa2Cu3O7, where Re=rare earth metal, BaSrCaCuO compounds, Tl compounds, Nb, Pb, and Nb compounds, or A15 superconductor.

12. The vortex diode in accordance with claim 1, wherein a thickness of 0.1 to 2.0 μm is used for the superconducting stripline.

13. The vortex diode in accordance with claim 1, wherein the substrate comprises a crystalline structure of sapphire, LaAlO3, MgO, or Si.

14. The vortex diode in accordance with claim 1, wherein the perforation grid has a wandering pattern, and wherein perforations of the perforation grid consist of round perforations of a common size.

15. The vortex diode in accordance with claim 14, wherein the perforation grid comprises non-equilateral triangular perforations in which nucleation of vortices is more probable at tips of the non-equilateral triangular perforations, due to a locally reduced superconducting property, than at other locations of the non-equilateral triangular perforations, so that a guided motion of the vortices proceeds from a tip of one non-equilateral triangular perforation to a next non-equilateral triangular perforation within a given row of non-equilateral triangular perforations.

16. A vortex diode, comprising:
a substrate; and
a superconducting stripline arranged thereon,
wherein the stripline has a plurality of perforations arranged in a plurality of straight rows and embodying a perforation grid;
wherein each one row of said plurality of straight rows extends from a first perforation nearest one edge of the stripline to a second perforation nearest an opposite edge of the stripline;
wherein for said each one row perforations are sized progressively larger from said first perforation to said second perforation; and
wherein said perforations of said perforation grid define probable locations for nucleation of vortices of the vortex diode, and wherein for a given row the perforations define a path of guided motion of said vortices.

17. The vortex diode of claim 16, in which the plurality of perforations are round shaped.

18. The vortex diode of claim 16, in which the plurality of perforations are isosceles triangular shaped.

19. The vortex diode in accordance with claim 16, further comprising DC contacts for detecting a DC signal.

20. The vortex diode in accordance with claim 16, further comprising coolant for producing temperatures below a critical temperature of the superconducting stripline.

21. The vortex diode in accordance with claim 16, further comprising means for embodying a magnetic field stronger than the earth magnetic field.

22. The vortex diode in accordance with claim 21, wherein at least one electromagnetic coil is the means for embodying the magnetic field.

23. The vortex diode in accordance with claim 16, wherein a Type II superconductor is a material of the superconducting stripline.

24. The vortex diode in accordance with claim 16, wherein a perforation size of the perforations is between 50 and 50,000 nanometers.

25. The vortex diode in accordance with claim 16, wherein the superconducting stripline includes one of $ReBa_2Cu_3O_7$, where Re=rare earth metal, BaSrCaCuO compounds, Tl compounds, Nb, Pb, and Nb compounds, or A15 superconductor.

26. The vortex diode in accordance with claim 16, wherein a thickness of 0.1 to 2.0 μm is used for the superconducting stripline.

27. The vortex diode in accordance with claim 16, wherein the substrate comprises a crystalline structure of sapphire, $LaAlO_3$, MgO, or Si.

28. The vortex diode in accordance with claim 16, wherein the perforation grid comprises non-equilateral triangular perforations in which nucleation of vortices is more probable at tips of the non-equilateral triangular perforations, due to a locally reduced superconducting property, than at other locations of the non-equilateral triangular perforations, so that a guided motion of the vortices proceeds from a tip of one non-equilateral triangular perforation to a next non-equilateral triangular perforation within a given row of non-equilateral triangular perforations.

29. The vortex diode in accordance with claim 16, wherein the perforation grid comprises a straight arrangement of round perforations in which vortices are transported starting from smallest ones of the round perforations in a direction of perforations having increasingly large radii.

* * * * *